United States Patent [19]

Kondo et al.

[11] Patent Number: 5,138,279
[45] Date of Patent: Aug. 11, 1992

[54] LEAPFROG FILTER
[75] Inventors: Hiroshi Kondo; Tsuneo Tohyama, both of Iruma, Japan
[73] Assignee: Toko, Inc., Tokyo, Japan
[21] Appl. No.: 550,335
[22] Filed: Jul. 9, 1990
[30] Foreign Application Priority Data
  Jul. 13, 1989 [JP] Japan .................. 1-180699
[51] Int. Cl.[5] .............................. H03F 1/34
[52] U.S. Cl. ................... 330/294; 330/107; 330/305; 330/306
[58] Field of Search ............... 330/107, 109, 294, 305, 330/306; 307/520; 328/167
[56] References Cited
  U.S. PATENT DOCUMENTS
  3,792,367  2/1974  Fleischer et al. ............... 328/167 X Primary Examiner—James B. Mullins

[57] ABSTRACT

A leapfrog filter comprises a first integrator made up of a first operational amplifier and a first capacitor connected to output terminal of the first operational amplifier; a second integrator made up of a second operational amplifier and a second capacitor connected to inverting input terminal and output terminal of the second operational amplifier; and a variable current source circuit. The first operational amplifier has the output terminal thereof connected to non-inverting input terminal of the second operational amplifier. The second operational amplifier has the output terminal thereof connected to inverting input terminal of the first operational amplifier. An input terminal is connected to non-inverting input terminal of the first operational amplifier; and output terminal connected to the output terminal of the second operational amplifier. The variable current source circuit is arranged such that bias currents supplied to the first and second operational amplifiers are controlled so as to change mutual conductances of the first and first operational amplifiers, thereby adjusting pass band width of the filter while at the same time restraining occurrence of in-band ripple.

1 Claim, 6 Drawing Sheets

LEAPFROG FILTER

BACKGROUND OF THE INVENTION

1. Field of the Invention

This invention relates to leapfrog filter, and more particularly it pertains to such a filter which is so designed as to be easy to adjust the pass band width thereof and less likely to produce in-band ripple.

2. Description of the Prior Art

Figure 1:
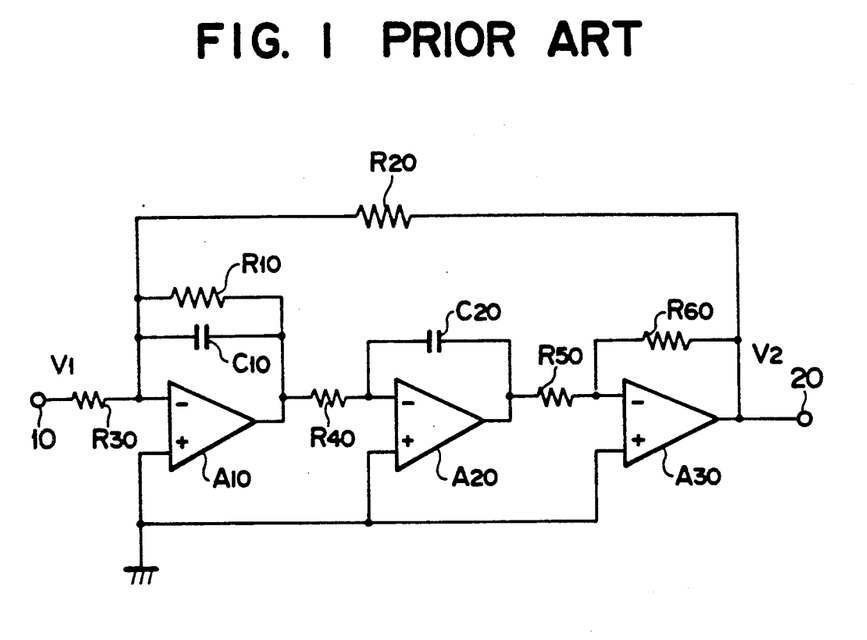
FIG. 1 is a circuit diagram showing a biquad circuit constituting an example of conventional active filter.

Referring to FIG. 1, description will first be made of an example of conventional active filter, which is constructed in the form of biquad circuit constituting a low-pass filter. The transfer function T(S) of a common low-pass filter is given as follows:

$$T(s) = \frac{\pm H \omega_0^2}{s^2 + (\omega_0/Q) s + \omega_0^2} \quad (1)$$

where $\omega_0$ is angular frequency; s is complex variable; Q is quality factor; and H is gain factor.

The relationship between input and output voltages $V_1$ and $V_2$ of the biquad circuit can be expressed in the form of transfer function T(S) as follows:

$$\begin{aligned}T(s) &= V_2/V_1 \\ &= \frac{-1/R_{30} R_{40} C_{10} C_{20}}{s^2 + (1/R_{10} C_{10}) s + 1/R_{20} R_{40} C_{10} C_{20}}\end{aligned} \quad (2)$$

Assuming that the factor of each term in Equation (1) and that in Equation (2) are equal to each other, the angular frequency $\omega_0$ is given as follows:

$$\omega_0^2 = 1/R_{20} R_{40} C_{10} C_{20}$$

Further, since the angular frequency $\omega_0$ is given as $\omega_0 = 2\pi F_0$, the center frequency $f_0$ can be expressed as follows:

$$f_0 = \tfrac{1}{2}\pi \cdot \sqrt{R_{20} R_{40} C_{10} C_{20}} \quad (3)$$

Still further, from the Equations (1) and (2), the quality factor can be expressed as follows:

$$Q = \sqrt{R_{10}^2 C_{10}/R_{20} R_{40} C_{20}} \quad (4)$$

As will be seen from Equation (3), it is required that circuit constants such as resistors $R_{20}$ and $R_{40}$ or capacitors $C_{10}$ and $C_{20}$ be made variable in an attempt to make variable the center frequency $f_0$. Thus, to make variable the center frequency $f_0$, the conventional biquad circuit requires externally mounted components such as the resistors $R_{20}$ and $R_{40}$ or capacitors $C_{10}$ and $C_{20}$ which are unsuitable for semiconductor integrated circuit fabrication. With the conventional biquad circuit, it is required that constants such as resistors $R_{20}$ and $R_{20}$ or capacitors $C_{10}$ and $C_{20}$ be changed when it is attempted to provide the desired center frequency $f_0$. As will be noted from Equation (4), however, the quality factor Q is also changed by adjusting the externally mounted components, and this requires that the other circuit constants be also changed.

Furthermore, the conventional active filter such as shown in FIG. 1 is disadvantageous in that the manufacturing cost is high because a number of electronic components are mounted onto a printed circuit board. Another disadvantage is such that when it is attempted to adjust the center frequency $f_0$ of the filter, it is required that such adjustment be effected with components having the circuit constants thereof set at predetermined values being mounted on the printed circuit board, and this inevitably increases the number of steps for bandwidth adjustment and assembling of the filter.

SUMMARY OF THE INVENTION

The present invention has been made with a view to obviating the aforementioned drawbacks of the prior art. Accordingly, it is a primary object of the present invention to provide a leapfrog filter which is so designed to be easier to adjust the center frequency $f_0$ and set up the pass band width.

Another object of the present invention is to provide a leapfrog filter which is designed so that in-band ripple is less likely to occur when adjustment of the pass band width is effected.

Still another object of the present invention is to provide a leapfrog filter which is so designed as to have the number of components reduced and to be well adapted for fabrication in the form of semiconductor integrated circuit.

Briefly stated, according to an aspect of the present invention, there is provided a leapfrog filter which comprises a first integrator made up of a first operational amplifier and a capacitor connected to output terminal of the first operational amplifier; a second integrator made up of a second operational amplifier and a second capacitor connected to inverting input terminal and output terminal of the second operational amplifier; and a variable current source circuit. The first operational amplifier has the output terminal thereof connected to non-inverting input terminal of the second operational amplifier. The second operational amplifier has the output terminal thereof connected to inverting input terminal of the first operational amplifier. An input terminal is connected to non-inverting input terminal of the first operational amplifier; and output terminal connected to the output terminal of the second operational amplifier. The variable current source circuit is arranged such that bias currents supplied to the first and second operational amplifiers are controlled so as to change mutual conductances of the first and first operational amplifiers, thereby adjusting pass band width of the filter while the same time restraining occurrence of in-band ripple.

Other objects, features and advantages of the present invention will become apparent from the ensuing description taken in conjunction with the accompanying drawings.

DESCRIPTION OF THE PREFERRED EMBODIMENTS

Figure 2:
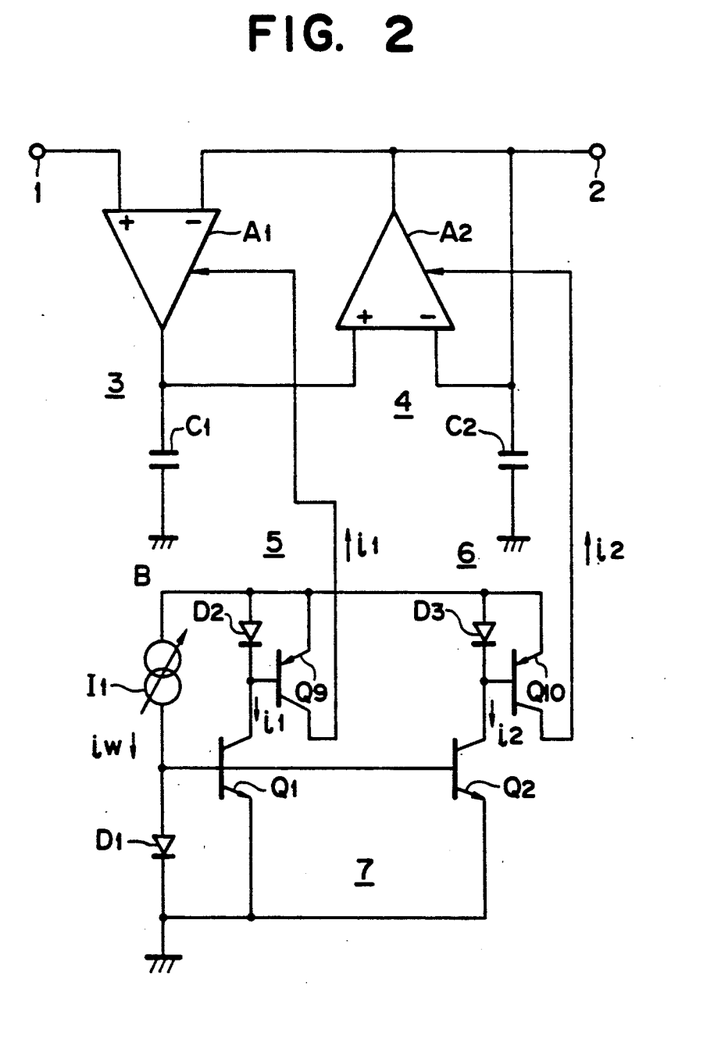
FIG. 2 is a circuit diagram showing the leapfrog filter according to an embodiment of the present invention.

Referring to FIG. 2 of the accompanying drawings, there is shown the leapfrog filter according to an embodiment, wherein an input terminal 1 is connected to non-inverting terminal of an operational amplifier $A_1$, the output terminal of which is coupled to a capacitor $C_1$, and also to non-inverting terminal of another operational amplifier $A_2$. Inverting terminal of the operational amplifier $A_1$ is connected to the output terminal and inverting terminal of the operational amplifier $A_2$, and also to a capacitor $C_2$ and an output terminal 2. The operational amplifier $A_1$, together with the capacitor $C_1$ connected to the output terminal thereof, constitutes an integrator 3; and the operational amplifier $A_2$ also, together with the capacitor $C_2$ coupled to the output terminal thereof, constitutes an integrator 4. The integrator 4 is of a self negative feedback type wherein the inverting input terminal of the operational amplifier $A_2$ is connected to the output terminal thereof. The integrator 3 has its output terminal coupled to the non-inverting input terminal of the operational amplifier $A_2$, the output terminal of which in turn is connected to the inverting input terminal of the operational amplifier $A_1$, so that negative feedback is applied thereto. In this way, a secondary low-pass filter is formed.

A variable current source circuit 7 is arranged to supply currents $i_1$ and $i_2$ to the operational amplifiers $A_1$ and $A_2$ as bias currents respectively through current source circuits 5 and 6 each of which comprises a current-mirror circuit. The variable current source circuit 7 comprises transistors $Q_1$ and $Q_2$ which are biased with forward voltage of a diode $D_1$, to which a current $i_W$ is supplied from a variable current source circuit $I_1$; and the current source circuits 5 and 6 connected to the collectors of the transistors $Q_1$ and $Q_2$ respectively. The current source circuit 5 comprises a current-mirror circuit which is constituted by a diode $D_2$ and transistor $Q_9$, and the current source circuit 6 also comprises a current-mirror circuit which is formed by a diode $D_3$ and transistor $Q_{10}$.

With such a leapfrog filter, collector currents $i_1$ and $i_2$ of the transistors $Q_1$ and $Q_2$ are drawn in through the current source circuits 5 and 6 so that the currents $i_1$ and $i_2$, i.e., mirror currents corresponding to variations in the variable current $i_w$ are supplied from the transistors $Q_9$ and $Q_{10}$ provided at the output stage of the current source circuits 5 and 6 to the operational amplifiers $A_1$ and $A_2$ respectively. The relationship between the variable current $i_W$ and the currents $i_1$, $i_2$ is shown at (a) in FIG. 9.

Figure 3:
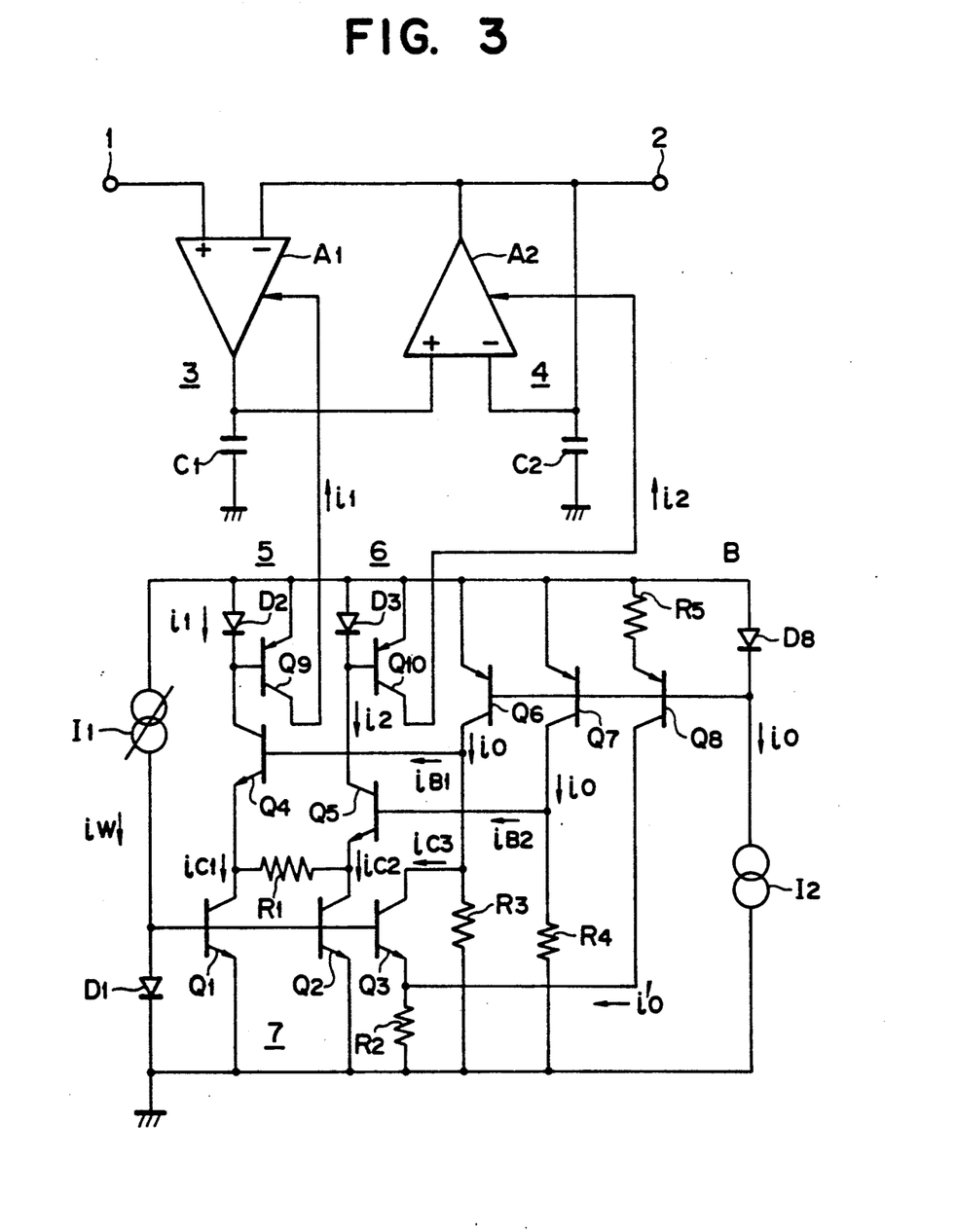
FIG. 3 is a circuit diagram showing the leapfrog filter according to another embodiment of the present invention.
Figure 4:
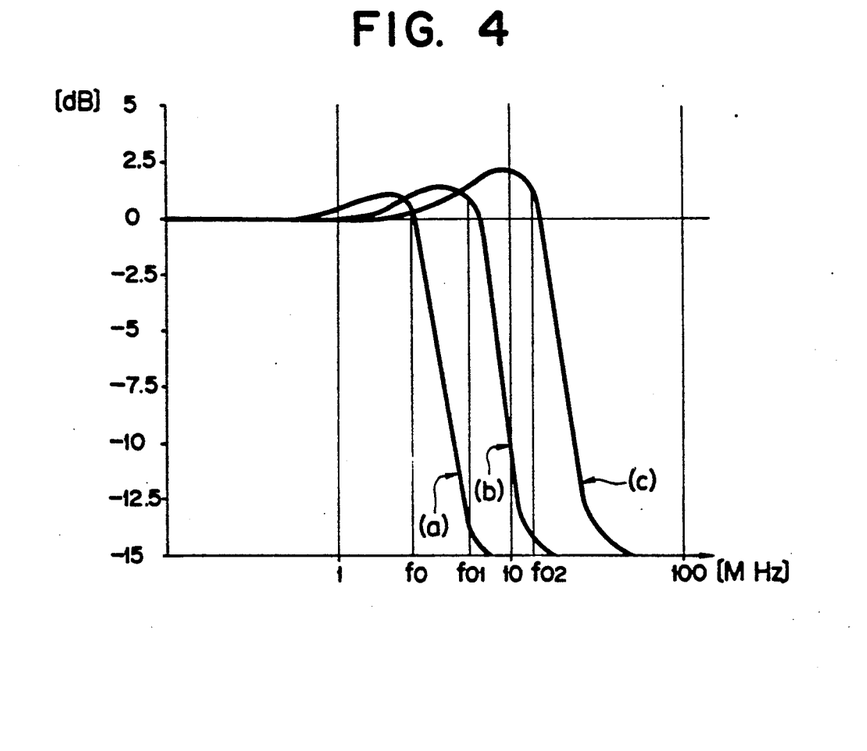
FIG. 4 illustrates the frequency characteristics of the embodiment shown in FIG. 2.

The filter characteristics of the embodiment shown in FIG. 2, are illustrated in FIG. 4, wherein the abscissa indicates frequency, and the ordinate represents attenuation. As the variable current $i_W$ is increased, the currents $i_1$ and $i_2$ supplied to the operational amplifiers $A_1$ and $A_2$ through the current source circuits 5 and 6 respectively are also increased. In such a case, the frequency characteristics of the filter is changed as indicated at (a), (b) and (c) in FIG. 4, from which it will be noted that the center frequency $f_0$ is changed toward higher values $f_{01}$, $f_{02}$ so that the pass band width is increased. Disadvantageously, however, as the variable current $i_W$ is increased, the quality factor Q will also be changed due to element sensitivity variations which tend to result from deterioration in the high-frequency characteristics of elements constituting the leapfrog filter. Such variations in the in-band characteristic of the filter will increase in-band ripple such as shown in FIG. 4. For the case where flat frequency characteristic is required, such a problem of in-band ripple can be most effectively coped with by means of such an arrangement as shown in FIG. 3.

FIG. 3 shows the leapfrog filter according to a second embodiment of the present invention, which is different from the embodiment of FIG. 2 in respect of variable current source circuit 7. In this embodiment, the variable current source circuit 7 includes transistors $Q_1$, $Q_2$ and $Q_3$ each having its base connected to the anode of a diode $D_1$ to which a current $i_W$ is supplied from a variable current source $I_1$. The transistor $Q_1$ has its collector connected to the emitter of a transistor $Q_4$ which has its collector coupled to the cathode of a diode $D_2$ and to the base of a transistor $Q_9$. The current $i_1$ is supplied to the operational amplifier $A_1$ through the transistor $Q_9$. The collector of the transistor $Q_2$ is connected to the emitter of the transistor $Q_5$, and the collector of the transistor $Q_5$ is coupled to the cathode of a diode $D_3$, and to base of the transistor $Q_{10}$. The current $i_2$ is supplied to the operational amplifier $A_2$ through the transistor $Q_{10}$. Further, a resistor $R_1$ is connected between the collectors of the transistors $Q_1$ and $Q_2$. The collector of the transistor $Q_3$ is connected to the base of the transistor $Q_4$, the collector of transistor $Q_6$, and one end of a resistor $R_3$. Transistors $Q_6$ to $Q_8$ have their bases coupled to the cathode of a diode $D_8$, and to a constant current source circuit $I_2$. A resistor $R_5$ is connected at one end to the emitter of the transistor $Q_8$, the other end of the resistor $R_5$ being coupled to a voltage source B. The collector of the transistor $Q_8$ is connected to the emitter of the transistor $Q_3$ and resistor $R_2$. The collector of the transistor $Q_7$ is connected to the base of the transistor $Q_5$ and resistor $R_4$. The resistors $R_2$ to $R_4$ are grounded at the other ends. As in the embodiment shown in FIG. 2, the current source circuit 5 comprises a current mirror circuit constituted by the diode $D_2$ and transistor $Q_9$, and the current source circuit 6 comprises a current mirror circuit formed by the diode $D_3$ and transistor $Q_{10}$. Currents $i_1$ and $i_2$ are supplied to the operational amplifiers $A_1$ and $A_2$ through these current source circuits 5 and 6 so that the mutual conductance of each of these operational amplifiers $A_1$ and $A_2$ is adjusted.

With the embodiment of FIG. 3, variable current $i_W$ derived from the variable current source circuit $I_1$ is supplied to the diode $D_1$ so that the transistors $Q_1$ to $Q_3$ are biased. Meanwhile, constant current $i_0$ is being drawn in by the constant current source circuit from the diode $D_8$ and transistors $Q_6$ to $Q_8$, so that the transistors $Q_6$ to $Q_8$ are biased with the forward voltage of the diode $D_8$. Current $i_0'$ is supplied to the resistor $R_2$ through the transistor $Q_8$, and the voltage across the resistor $R_2$ and the forward voltage of the diode $D_1$ are compared with each other by means of the transistor $Q_3$. If the forward voltage of the diode $D_1$ is lower than the voltage across the resistor $R_2$, then the transistor $Q_3$ is turned off so that current $i_0$ is supplied to resistors $R_3$ and $R_4$ through the transistors $Q_6$ and $Q_7$ respectively so that the transistor $Q_4$ and $Q_5$ are biased with equal terminal voltages occurring across the resistors $R_3$ and $R_4$ respectively; and collector currents $i_1$ and $i_2$ are drawn in from the current source circuits 5 and 6 so that the equal currents $i_1$ and $i_2$ are supplied to the operational amplifiers $A_1$ and $A_2$ through the transistors $Q_9$ and $Q_{10}$ at the output stages of the current source circuits 5 and 6 respectively.

By increasing the current $I_W$ provided by the variable current source circuit $I_1$, the forward voltage of the diode $D_1$ is caused to build up; and when the forward voltage becomes higher than the terminal voltage of the resistor $R_2$, the transistor $Q_3$ is rendered operative so that collector current $i_{C3}$ is caused to flow. At the same time, collector currents $i_{C1}$ and $i_{C2}$ of the transistors $Q_1$ and $Q_2$ are also increased. Current $i_0$ supplied from the transistor $Q_6$ to the resister $R_3$ is lower by the amount of the collector current $i_{C3}$ than current $i_0$ supplied from the transistor $Q_7$ to the resistor $R_4$; thus, base current $i_{B1}$ of the transistor $Q_4$ is decreased. For the increase in the variable current $i_W$, currents $i_1$ and $i_2$ depending on base currents $i_{B1}$ and $i_{B2}$ of the transistors $Q_4$ and $Q_5$ are supplied to the operational amplifiers $A_1$ and $A_2$ through the current source circuits 5 and 6 respectively.

Figure 5:
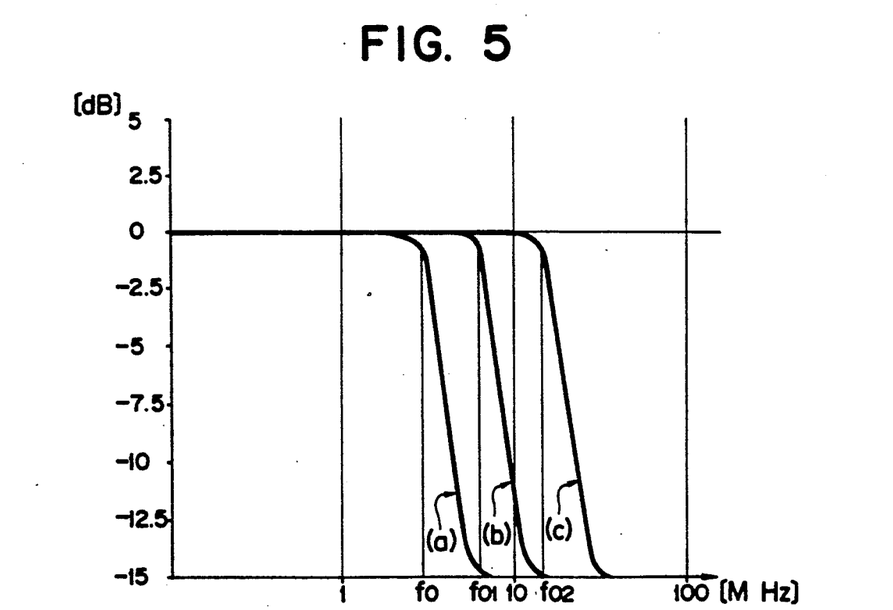
FIG. 5 illustrates the frequency characteristics of the embodiment shown in FIG. 3.
Figure 9:
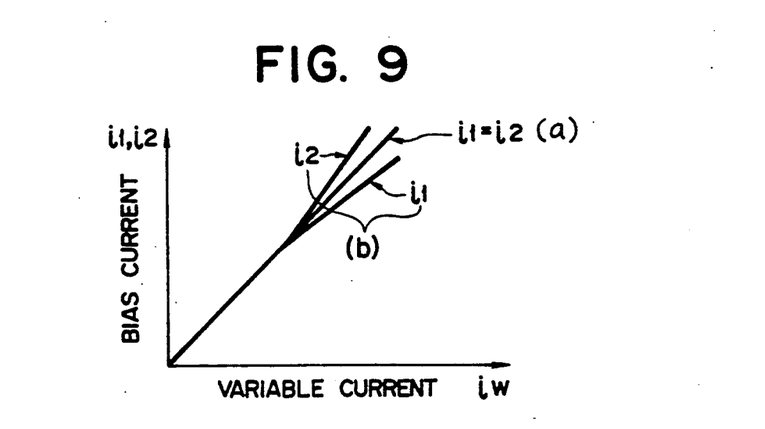
FIG. 9 illustrates the relationship between a variable current $i_W$ and current $i_1$, $i_2$.

Referring to FIG. 9, there is illustrated the relationship between the variable current $i_w$ and the currents $i_1$, $i_2$, wherein the abscissa indicates the value of the variable current $i_W$, and the ordinate represents the values of the bias currents $i_1$, $i_2$. In FIG. 9, the operational characteristic of the embodiment shown in FIG. 3 is shown at (a). From FIG. 9, it will be noted that the variable current source circuit 7 provided in the embodiment of FIG. 3, the current $i_1$ supplied to the operational amplifier $A_1$ is controlled so that its increasing rate is restrained with respect to the current $i_2$ supplied to the operational amplifier $A_2$. Thus, it is possible to change the center frequency $f_0$ by controlling the currents $i_1$, $i_2$ with respect to variations in the variable current $i_w$. In this way, the filter characteristic of this embodiment can be made to be such a flat one as shown in FIG. 5 wherein by increasing the current $i_w$, the center frequency $f_0$ is changed to a higher frequency such as $f_{01}$, $f_{02}$ so that the pass band width is expanded and occurrence of ripple is restrained.

Figure 6:
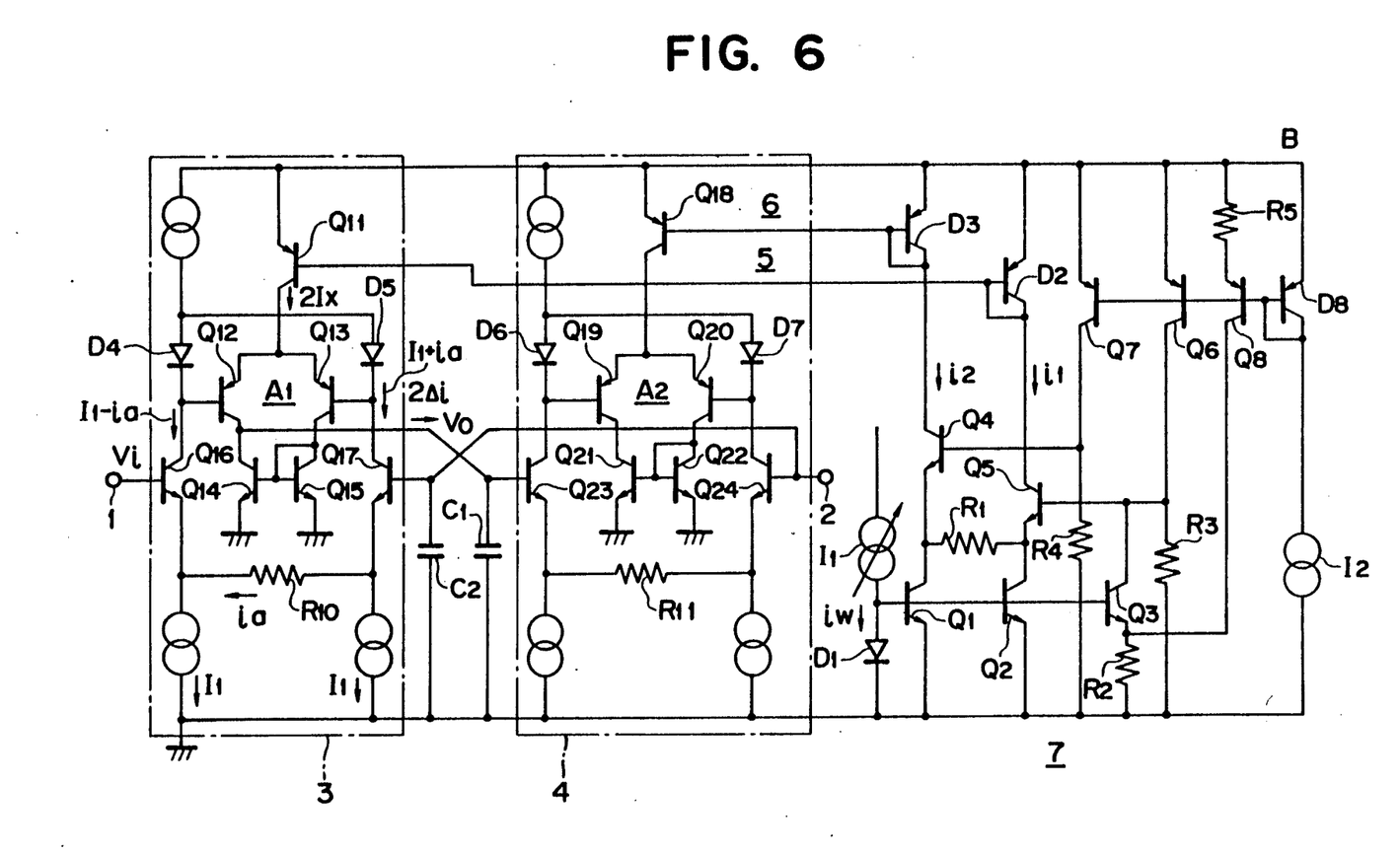
FIG. 6 is a circuit diagram showing a more practical version of the arrangement of FIG. 3.

FIG. 6 illustrates a more practical version of the leapfrog filter according to the embodiment shown in FIG. 2. In FIG. 6, an operational amplifier $A_1$ comprises a differential pair of transistors $Q_{12}$ and $Q_{13}$ having their collectors connected to the collectors of transistors $Q_{14}$ and $Q_{15}$ which constitute a current-mirror circuit. The emitters of the transistors $Q_{12}$ and $Q_{13}$, which are connected together, are connected to the collector of a transistor $Q_{11}$, the emitter of which is coupled to a power source voltage B. The transistors $Q_{12}$ and $Q_{13}$ have their bases connected to the cathodes of diodes $D_4$ and $D_5$, the anodes of which are connected together and to a current source comprising a diode or the like. Further, the bases of the transistors $Q_{12}$ and $Q_{13}$ are coupled to the collectors of transistors $Q_{16}$ and $Q_{17}$ respectively; a resistor $R_{10}$ is connected between the emitters of the transistors $Q_{16}$ and $Q_{17}$; and the emitters of the transistors $Q_{16}$ and $Q_{17}$ are grounded through the current source. A capacitor $C_1$ is connected to the inter-connected collectors of the transistors $Q_{12}$ and $Q_{14}$; and the operational amplifier $A_1$, together with the capacitor $C_1$, constitutes an integrating circuit 3 which in turn is connected to the base of a transistor $Q_{23}$ provided in a succeeding operational amplifier $A_2$. The transistor $Q_{11}$ is connected with diode $D_2$ so as to constitute a current-mirror circuit, and the connection is made such that the current $i_1$ is supplied to the operational amplifier $A_1$.

The operational amplifier $A_2$ comprises $Q_{19}$ and $Q_{20}$ having their collectors connected to the collectors of transistors $Q_{21}$ and $Q_{22}$ respectively, the transistors $Q_{21}$ and $Q_{22}$ constituting a current-mirror circuit. The inter-connected emitters of the transistors $Q_{19}$ and $Q_{20}$ are connected to the collector of transistor $Q_{18}$, the emitter of which is coupled to the power source voltage B. The transistors $Q_{19}$ and $Q_{20}$ have their bases connected to the cathodes of diodes $D_6$ and $D_7$ respectively, the anodes of the diodes $D_6$ and $D_7$ being connected together and to a current source comprising a diode or the like. A resistor $R_{11}$ is connected between the emitters of transistors $Q_{23}$ and $Q_{24}$, the emitters of which are grounded through current sources respectively. The transistor $Q_{23}$ has its base connected to capacitor $C_1$. Capacitor $C_2$ is coupled to the inter-connected collectors of the transistors $Q_{19}$ and $Q_{21}$ and to the base of the transistor $Q_{17}$ of the integrating circuit 3, the capacitor $C_2$ being also connected to the output terminal 2. Transistor $Q_{18}$ is connected with diode $D_3$ so as to constitute a current-mirror circuit, and the connection is made such that the current $i_2$ is supplied to the operational amplifier $A_1$. Variable current source circuit 7 is identical with that provided in the embodiment of FIG. 2, and therefore description of the construction thereof will be omitted.

Description will now be made of the operation of the integrating circuit of the leapfrog filter shown in FIG. 6, wherein $V_i$ indicates input voltage; $V_o$ represents output voltage; and $I_1$ and $I_x$ denote bias current. Let it be assumed that signal component current is $i_o$; that current flowing through the resistor $R_{10}$ is $i_a$; and that AC voltage $V_i$ applied to the bases of the transistors $Q_{12}$ and $Q_{15}$. Then, the following equation holds:

$$i_a = V_i/R_{10} \quad (5)$$

Also let it be assumed that the difference between the base voltages of the transistors $Q_{12}$ and $Q_{13}$ is $V_a$. The following relationship holds true:

$$\begin{aligned} V_a &= V_T \ln(I_1 + i_a)/I_{s1} \\ &\quad - V_T \ln(I_1 - i_a)/I_{s1} \\ &= V_T \ln(I_1 + i_a)/(I_1 - i_a) \end{aligned} \quad (6)$$

$$\begin{aligned} V_a &= V_T \ln(I_x + i_o)/I_{s2} \\ &\quad - V_T \ln(I_x - i_o)/I_{s2} \\ &= V_T \ln(I_x + i_o)/(I_x - i_o) \end{aligned} \quad (7)$$

where $I_{s1}$ and $I_{s2}$ are saturation currents between the base and emitter of the transistors $Q_{12}$ and $Q_{13}$ which are equal to each other; and $V_T$ is thermal voltage.

The following equations are derived from Equations (6) and (7):

$$\ln(I_1 + i_a)/(I_1 - i_a) = \ln(I_x + i_o)/(I_x - i_o)$$

$$(I_1 + i_a)/(I_1 - i_a) = (I_x + 1_o)/(I_x - i_a)$$

By rearranging the above expressions and putting Equation (5) therein, the signal current $i_o$ is given as follows:

$$i_o = I_x i_a/I_1 = I_x \Delta V_1/I_1 R_{10} \quad (8)$$

Output voltage $V_o$ of the integrating circuit is given $$V_o = I_x V_i / I_1 R_{10} sC \tag{9}$$

Thus, the following equation is derived from Equation (9):

$$V_o/V_i = I_x/I_1 \cdot 1/R_{10} \cdot 1/sC \tag{10}$$

From Equation (9), mutual conductance gm may be expressed as follows:

$$gm = \partial i_o / \partial V_o = I_x / I_1 \cdot 1/R_{10} \tag{11}$$

Then, the transfer function T(S) of the integrating circuit shown in FIG. 5 can be written as follows:

$$T(S) = V_o/V_i = gm/sC = 1/srC$$

where $r = 1/gm$.

It is apparent that the mutual conductance of the operational amplifier $A_1$ is such that $r = 1/gm$, and that the transfer function T(S) of the integrator depends on the function of bias current $I_1$, $I_x$ and resistance $R_{10}$. It will be seen that the integrating circuit changes the transfer function T(S) of the integrator by controlling the bias current $I_x$.

Description will now be made of the secondary leapfrog filter shown in FIG. 2 using the above-mentioned integrating circuit, by referring to the equivalent circuit of the secondary leapfrog filter shown in FIG. 6.

Based on the equivalent circuit of FIG. 6, the following equations hold:

$$I_1 = Y_1 (V_1 - V_2) \tag{12}$$

$$V_2 = Z_2 \cdot I_1 \tag{13}$$

By using voltage quantities, these two equations can be rewritten as follows:

$$V I_1 = T_{y1} (V_1 - V_2) \tag{14}$$

$$V_2 = T_{z2} \cdot V_{I1} \tag{15}$$

The following equations are also obtained:

$$T_{y1} = 1/s L \text{ where } s = j\omega$$

$$T_{z2} = 1/(1 + s C)$$

Figure 7:
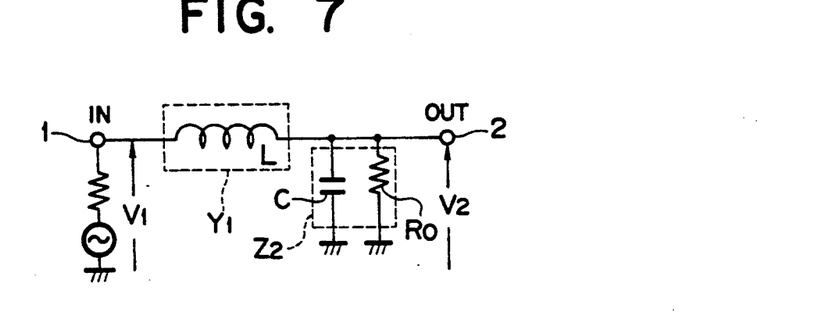
FIG. 7 shows an equivalent circuit of a secondary low-pass filter.
Figure 8:
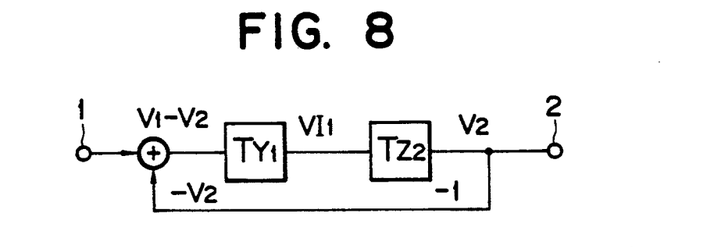
FIG. 8 is a feedback diagram of the secondary low-pass filter.

From such expressions, it is possible to depict the signal diagram shown in FIG. 7.

The admittance Y1 of coil L shown in the equivalent circuit diagram of FIG. 6 is given as follows:

$$A(s) = \frac{1}{sL \cdot 1/gm} \tag{16}$$

Since $gm = 1/r$, Equation (16) can be rewritten as follows:

$$A(s) = 1/s L r$$

By letting $r = 1$, Equation (16) is rewritten as follows:

$$A(s) = 1/s L \tag{17}$$

The impedance $Z_2$ of the equivalent circuit of FIG. 6 is expressed in terms of transfer function B(s) as follows:

$$\begin{aligned} B(s) &= \frac{gm/s\,C}{1 + gm/s\,C} = \frac{1}{1 + s\,C/gm} \\ &= 1/(1 + s\,C\,r) \end{aligned} \tag{18}$$

By letting $r = 1$, Equation (18) is rewritten as follows:

$$B(s) = 1/(1 + s\,C)$$

Thus, the total transfer function T¢(s) of the leapfrog filter is given as follows:

$$\begin{aligned} T(s) &= V_2/V_1 \\ &= T_{yi} T_{22}/(1 + T_{y1} T_{z2}) \\ &= A(s) B(s)/(1 + A(s) B(s)) \end{aligned} \tag{19}$$

A(s) and B(s) can be rewritten as follows:

$$A(s) = 1/s L, [1/s L r] \tag{20}$$

$$\begin{aligned} B(s) &= 1/(1 + s\,C) \\ &= 1/(1 + s\,C\,r) \end{aligned} \tag{21}$$

The transfer functions A(s) and B(s) can also be rewritten as follows:

$$A(s) = 1/sL = Q\,\omega_o/s \tag{22}$$

By letting $1/s\,C = \omega_o/s\,Q$, the transfer function B(s) of $Z_2$ is written as below.

$$\begin{aligned} B(s) &= 1/(1 + s\,C) \\ &= (\omega_o/s\,Q)/(1 + \omega_o/s\,Q) \\ &= (\omega_o/Q)/(s + \omega_o/Q) \end{aligned} \tag{23}$$

Thus, by putting Equations (22) and (23) in Equation (19) it is possible to express the total transfer function T(s) as follows:

$$\begin{aligned} T(s) &= A(s) \cdot B(s)/(1 + A(s) \cdot B(s)) \\ &= \omega_o^2/(s^2 + \omega_o/Q\,s + \omega_o^2) \end{aligned} \tag{24}$$

Description will next be made of the variable current source circuit 7 of the leapfrog filter shown in FIG. 2.

Let it be assumed that r ($r = 1/gm$) of the operational amplifiers 3 and 5 constituting the integrators is $r_1$ and $r_2$ respectively, and that the capacitance of the capacitors 4 and 6 is $C_1$ and $C_2$ respectively. The transfer function of each integrator is then expressed as follows:

$$Q\,\omega_o/s = 1/s\,r_1\,C_1$$

$$\omega_o/s\,Q = 1/s\,r_2\,C_2$$

Further, by rearranging the above equations, the following expressions can be obtained:

$$Q\,\omega_o = 1/s\,r_1\,C_1 \tag{25}$$

$$\omega_o/Q = 1/r_2\,C_2 \tag{26}$$

Still further, the following equations hold true:

$$1/r_1 = gm_1 = i_1/I_1 \cdot R_{10}$$

$$1/r_2 = gm_2 = i_2/I_2 \cdot R_{10}$$

By rearranging the above expressions, it is possible to obtain the following equations:

$$r_1 = I_1 \cdot R_{10}/i_1 \quad (27)$$

$$r_2 = I_1 \cdot R_{10}/i_2 \quad (28)$$

Thus, the quality factor Q can be sought from Equations (25) and (26) as mentioned below. By putting Equations (27) and (28) in the expression thus sought, the following equations are obtained:

$$\begin{aligned} Q\omega_o/(\omega_o/Q) &= Q^2 \\ &= r_2 C_2/r_1 C_1 \\ &= (C_2 I_2 R_{10}/i_2)/(C_1 I_1 R_{10}/i_1) \end{aligned}$$

Consequently, the quality factor Q can be written as follows:

$$Q = (C_2 i_1/C_1 i_2)^{\frac{1}{2}} \quad (29)$$

The center frequency $\omega_o$ is sought from Equations (27) and (28). By putting Equations (27) and (28) in the resultant expression, the following expression is obtained:

$$\begin{aligned} Q\omega_o \cdot \omega_o/Q &= \omega_o^2 = 1/r_1 C_1 r_2 C_2 \\ &= i_1 i_2/C_1 C_2 I_1^2 R_{10}^2 \end{aligned}$$

Consequently, the center frequency $\omega_o$ is expressed as follows:

$$\omega_o = 1/I_1 R_{10} \cdot (i_1 i_2/C_1 C_2)^{\frac{1}{2}} \quad (30)$$

Let it be assumed that the factor $C_2/C_1$ in Equation (29) is $C_K$ which is constant, and that the factor $1/I_1 R_{10}(C_1 C_2)^{\frac{1}{2}}$ is $C_j$ which is also constant. The quality factor Q is given as follows:

$$\begin{aligned} Q &= [C_k \cdot i_1/i_2]^{\frac{1}{2}} \quad (31) \\ &= C_K^{\frac{1}{2}} \cdot (i_1/i_2)^{\frac{1}{2}} \\ \omega_0 &= C_j \cdot (i_1 \cdot i_2)^{\frac{1}{2}} \quad (32) \end{aligned}$$

As will be seen from Equations (31) and (32), the relationship between the currents $i_1$ and $i_2$ is that of multiplication and division. Further, by making different the bias currents $i_1$ and $i_2$ supplied to the operational amplifiers $A_1$ and $A_2$ in terms of increasing rate as shown in FIG. 9, the filter characteristic can automatically be made to be flat even though the center frequency is changed as shown at (a), (b) and (c) in FIG. 5. More specifically, by making the increasing rate of the current $i_1$ supplied to the operational amplifier $A_1$ at the signal input stage lower than the increasing rate of the current $i_2$ supplied to the operational amplifier $A_2$, it is possible to restrain the quality factor Q from being increased with an increase in the center frequency $f_0$ in such a manner that the quality factor Q turns out to be substantially uniform. In this way, it is possible to prevent in-band ripple from being increased due to variations in the in-band filter characteristic as shown in the frequency characteristics of FIG. 4, thereby achieving such a flat frequency response as shown in FIG. 5.

While in the foregoing embodiment, description has been made of the case of secondary low-pass filter, it is to be understood that even for an N-th order low-pass filter, it is possible to achieve the same result by controlling currents flowing in integrating circuits at the input and output stages on the basis of similar concept.

As will be appreciated from the above discussion, the present invention provides a leapfrog filter comprising an active filter which is well adapted for fabrication in the form of semiconductor integrated circuit and in which the number of externally mounted components is reduced as compared with the conventional one; and the in-band pass band width of the filter can be varied by increasing or decreasing the sum of currents $i_1$ and $i_2$ supplied to integrators constituting the present leapfrog filter. A further advantage is such that occurrence of in-band ripple can be restrained by changing the increasing rates of the currents $i_1$ and $i_2$.

As discussed above, the present leapfrog filter can be formed by an active filter in the form of a semiconductor integrated circuit so that the number of externally mounted components can be reduced; thus, according to the present invention, there is provided an expensive, miniaturized active filter.

While the present invention has been illustrated and described with respect to specific embodiments thereof, it is to be understood that the present invention is by no means limited thereto but encompasses all changes and modifications which will become possible within the scope of the appended claims.

We claim:

1. A leapfrog filter comprising:
    a first integrator made up of a first operational amplifier and a first capacitor connected to an output terminal of said first operational amplifier;
    a second integrator made up of a second operational amplifier of a self negative feedback type and a second capacitor connected to an inverting input terminal and output terminal of said second operational amplifier;
    said first operational amplifier having the output terminal thereof connected to a non-inverting input terminal of said second operational amplifier;
    said second operational amplifier having the output terminal thereof connected to an inverting input terminal of said first operational amplifier;
    an input terminal connected to a non-inverting input terminal of said first operational amplifier;
    an output terminal connected to the inverting input terminal of said first operational amplifier and the output terminal of said second operational amplifier;
    a variable current source circuit including a first and a second current source circuit for feeding bias currents of different increasing rates to said first and second operational amplifiers in such a manner that the increasing rate of the current supplied to the first operational amplifier is restrained with respect to the increasing rate of the current supplied to the second operational amplifier thereby restraining occurrence of in-band ripple so as to change pass band width of said filter.

* * * * *